United States Patent [19]

David et al.

[11] Patent Number: 5,455,605
[45] Date of Patent: Oct. 3, 1995

[54] INKER APPARATUS

[76] Inventors: Donald G. David, Jr., 3501 Thirty Fourth Cir., Rio Rancho, N.M. 87174; John A. Garrett, 533 S. Seawynds Blvd., Gilbert, Ariz. 85234

[21] Appl. No.: 956,373

[22] Filed: Oct. 5, 1992

[51] Int. Cl.[6] .......................... G01D 15/16; G01R 31/26
[52] U.S. Cl. ..................... 346/141; 346/33 F; 324/158.1
[58] Field of Search .............................. 346/140 R, 33 F, 346/140.1, 141; 324/158 F, 158 R, 158 T; 347/84, 85

[56] References Cited

U.S. PATENT DOCUMENTS 3,340,541  9/1967  Klasser et al. .................. 346/140.1
3,943,527  3/1976  Hartmann ........................ 346/33 F Primary Examiner—Joseph W. Hartary
Assistant Examiner—Craig A. Hallacher
Attorney, Agent, or Firm—H. Gordon Shields

[57] ABSTRACT

Inker apparatus includes an ink reservoir and a chamber communicating with the reservoir and in which chamber there is a piston movable against a spring bias. The chamber in which the piston is disposed is in turn connected to a needle through which ink is delivered. A solenoid is adjacent to the reservoir and chamber and is actuated in response to the finding of a defective die under test. The piston moves along with the reservoir and the chamber, and continues to move by inertia or kinetic energy after the reservoir and chamber have ceased their movement. The continued movement of the piston causes the displacement of ink from the chamber and from a hollow needle extending from the chamber and which in turn results in ink being placed on the defective die.

20 Claims, 3 Drawing Sheets

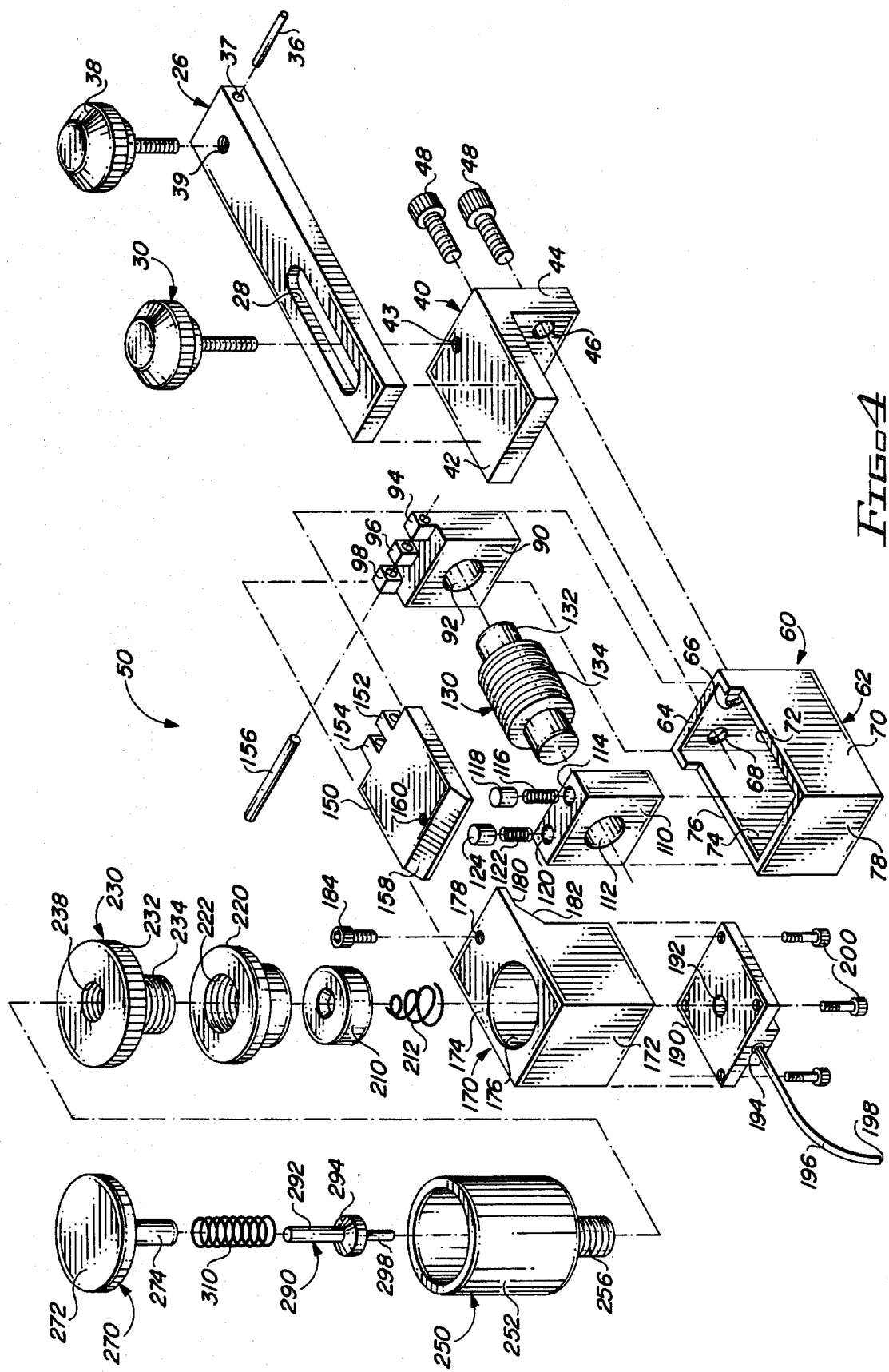

INKER APPARATUS

BACKGROUND OF THE INVENTION

1. Field of the Invention

This invention relates to inkers, and, more particularly, to inker apparatus for marking defective semiconductor wafer elements during and after testing procedures.

2. Description of the Prior Art

When a semiconductor wafer is tested, a plurality of probe needles engage different circuit elements on portions of the semiconductor element. The purpose of the testing is to determine or to detect defective circuits. The probe needles provide appropriate electronic signals for testing the circuit elements. If an element under test is determined to be defective, the particular wafer element will be marked by a spot of ink. The ink is placed on the wafer element by an inker apparatus.

When the semiconductor wafer is later cut into specific die elements, the die elements with the ink dots are rejected.

A semiconductor wafer may be processed after testing, and it is accordingly highly desirable or necessary that the ink remain on the defective elements during the processing.

Since a single semiconductor wafer includes a plurality of individual elements, each of which must be tested. In on line inking, ink is placed on each defective element at intervals during the testing of the wafer. The semiconductor wafer is successively indexed under the probe needles. The probe needles remain relatively fixed while the semiconductor wafer element moves relative to the probe needles. The inker apparatus is centered relative to the probe needles and accordingly is centered relative to each individual semiconductor element on a wafer as the elements are successively indexed beneath the probe needles. The inker apparatus moves vertically as required. Ink dots are deposited after testing a particular element which failed testing criteria. The wafer if then indexed to test the next element.

Some applications place the ink dots on defective circuit elements in an off-line mode. In this mode, defective element locations are stored in an electronic wafer map during testing. The wafer maps are then used on an off-line inking station (a station without a tester) and ink dots are deposited on defective circuits as discussed above according to the electronic wafer map. This mode of operation is more efficient as it does not hold up the expensive tester during the time it takes to deposit the ink dot.

The inker apparatus of the prior art generally includes an ink reservoir lined with a needle, and ink is delivered from the reservoir and through the needle in response to the activation of a solenoid which in turn activates a plunger associated with the reservoir. One such inker apparatus is described in U.S. Pat. No. 4,992,729 (Nadeau). In the '729 apparatus, the solenoid is generally parallel to the ink reservoir.

Another type of inker of the prior art uses gas pressure to force the ink out of a reservoir. This type of inker is generally referred to as a "pneumatic" inker.

SUMMARY OF THE INVENTION

The invention described and claimed herein comprises inker apparatus which includes a reservoir or vial for the ink disposed adjacent to a solenoid, and ink from the reservoir or vial flows into a chamber in which there is a freely movable piston. The solenoid actuation causes a movement of the ink reservoir and chamber, and there is a resulting movement of the piston. The movement of the chamber and the reservoir is a relatively shallow or short movement, and the inertia of the piston causes the piston to continue moving after the vial and chamber have stopped moving. The continued movement of the piston in turn results in the displacement of ink through a delivery needle and onto a defective die element disposed beneath the needle.

Among the objects of the present invention are the following:

To provide new and useful inker apparatus;

To provide new and useful inker apparatus utilizing a piston movable in an ink reservoir;

To provide new and useful inker apparatus in which actuation of a solenoid results in movement of adjacent reservoir and chamber elements and a piston disposed therein;

To provide new and useful inker apparatus in which movement of an ink vial prevents separation of ink components;

To provide new and useful inker apparatus in which a freely movable piston displaces ink which results in the deposition of ink on a defective die or wafer element in response to movement of a solenoid and of the chamber in which the piston is disposed;

To provide new and useful inker apparatus in which a nonmagnetic piston is moved in response to movement of a chamber of ink in which a piston is disposed.

To provide new and useful inker apparatus which controls the size of ink dots under varying inker duty cycles; and To provide new and useful inker apparatus which includes elements for preventing the dripping of ink between duty cycles.

BRIEF DESCRIPTION OF THE DRAWING

FIG. 4 is an exploded perspective view of the apparatus of FIGS. 2 and 3.

DESCRIPTION OF THE PREFERRED EMBODIMENT

Figure 1:
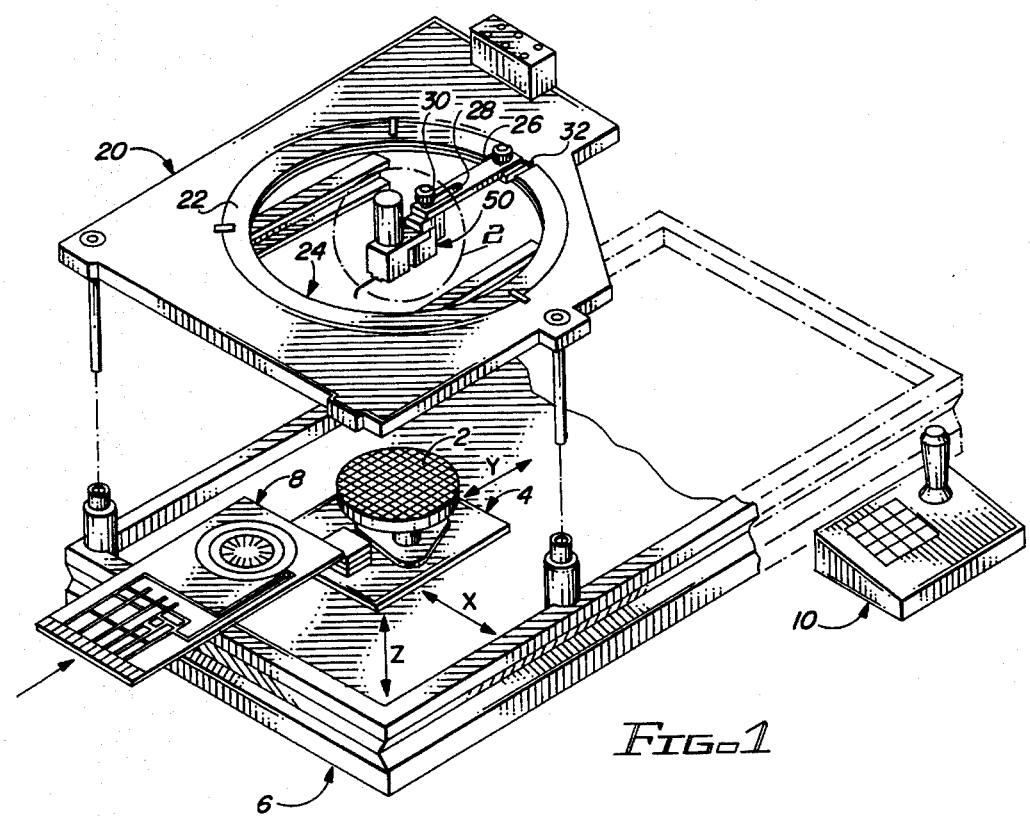
FIG. 1 is a perspective view of the apparatus of the present invention in its use environment.

FIG. 1 is a perspective view of inker apparatus 50 of the present invention in its use environment. The use environment of the inker apparatus 50 includes a wafer 2 secured to a holder 4. The holder 4 is in turn disposed on and movable on a table 6. The wafer 2 includes a plurality of integrated circuit elements or dies, each of which is to be tested. The testing of the integrated circuit elements or dies is accomplished by a probe card 8 which is appropriately disposed above the wafer 2 and its holder 4. The probe card 8 is also appropriately connected to the electrical circuitry which accomplishes the testing through a plurality of needles which extend radially inwardly from the probe card and which needles terminate in downwardly extending tips. The tips make electrical contact with circuit elements on each of the integrated circuit die on the wafer 2.

The holder 4 moves relative to the table 6 and to the probe card 8 in three dimensions, as is well known and understood in the art.

Adjacent to the table 6 is a control console 10. The control console 10 includes appropriate switches, joy stick, etc., to control the movement of the holder 4 and to control the testing of the individual integrated circuit dies through the probe card apparatus 8 and also the inking of a particular die which fails a test. The inker apparatus 50 is disposed above the probe card 8 and the wafer 2.

The inker apparatus 50 is appropriately secured to a support plate 20. The support plate 20 is in turn appropriately secured to and disposed above the table 6. The inker apparatus 50 moves vertically upwardly and downwardly, as required for marking purposes by a pivoting movement. The support plate 20 includes a carrier ring 22. Extending through the support plate 20 and the ring 22 is a relatively large aperture 24. The aperture 24 is in turn aligned with the wafer 2 and its holder 4 and the probe card 8.

Appropriately secured by a pin arrangement to the carrier ring 22 is a support arm 26. The support arm 26 includes a longitudinally extending slot 28. Disposed in the slot 28 is a lock screw and knob 30 which secures the support arm 26 to a support frame 40.

The support arm 26 is secured to the carrier ring 22 through a bracket 34. The bracket 34 is best shown in FIG. 1A, which comprises a perspective view of the bracket 34.

The carrier ring 22 includes a radial slot 32, and the elongated U-shaped bracket 34 is disposed in the slot 32 and is appropriately secured, as by screws 35, to the ring 22. The arm 26 is pivotally secured to or in the bracket 34 by a pin 36. The pin 36 extends through a pair of aligned apertures in the bracket 34 and through an aperture 37 in the arm 26. The aperture 37 extends transversely through the arm 26 at the opposite end of the arm 26 from the slot 28.

Between the slot 28 and the aperture 37 is a tapped aperture 39. The aperture 39 receives an adjusting screw 38. Rotation of the screw 38 causes the arm 26 to pivot on the pin 36 upwardly and downwardly relative to the bracket 34 and to the carrier ring 22.

Figure 1A:
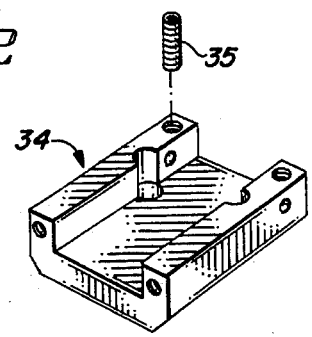
FIG. 1A is a perspective view of a portion of the apparatus of FIG. 1.

As shown in FIG. 1A, the bracket 34 includes a center trough, which comprises the bottom of the U-shape or configuration of the bracket 34. The arm 26 is disposed in the trough. The sides of the bracket 34, which extend upwardly from the trough, comprise the arms of the "U". The aligned apertures which receive the pin 36 extend through the arms of the "U" while the arm 26 is disposed between the arms of the "U". The bottom of the screw 38 contacts the trough or bottom of the elongated "U" to pivot the arm 26, and the ink or apparatus elements secured thereto, relative to the ring 22 and the plate 20. This pivoting movement comprises the Z movement of the inker apparatus 50.

Figure 3:
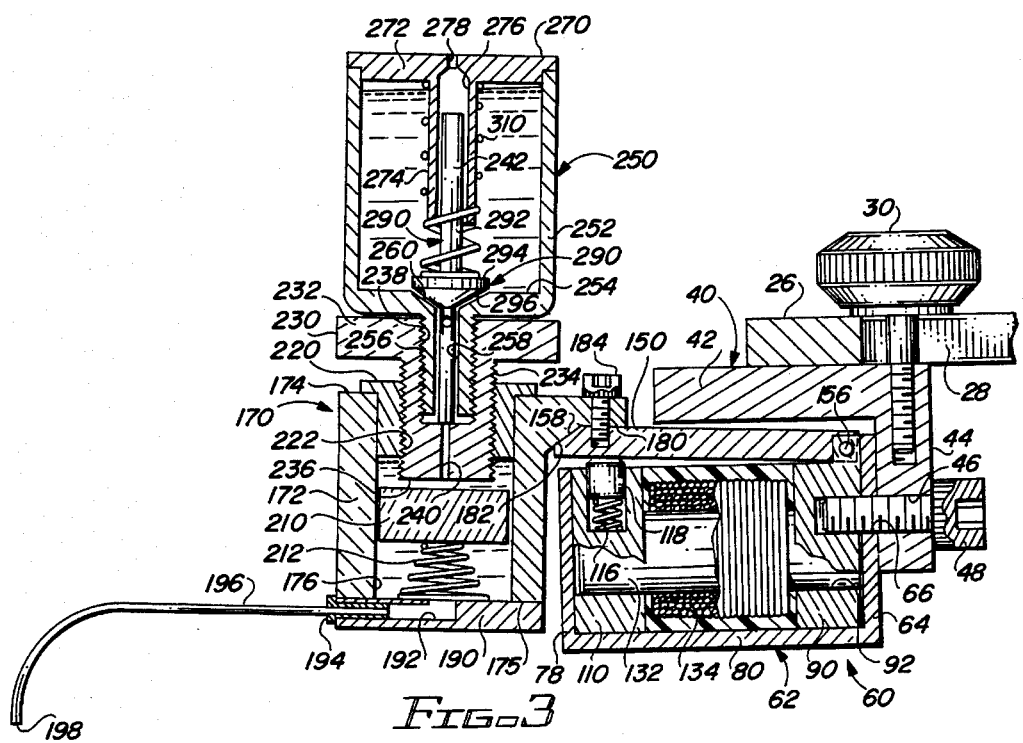
FIG. 3 is a side view in partial section taken generally along line 3—3 of FIG. 2.
Figure 2:
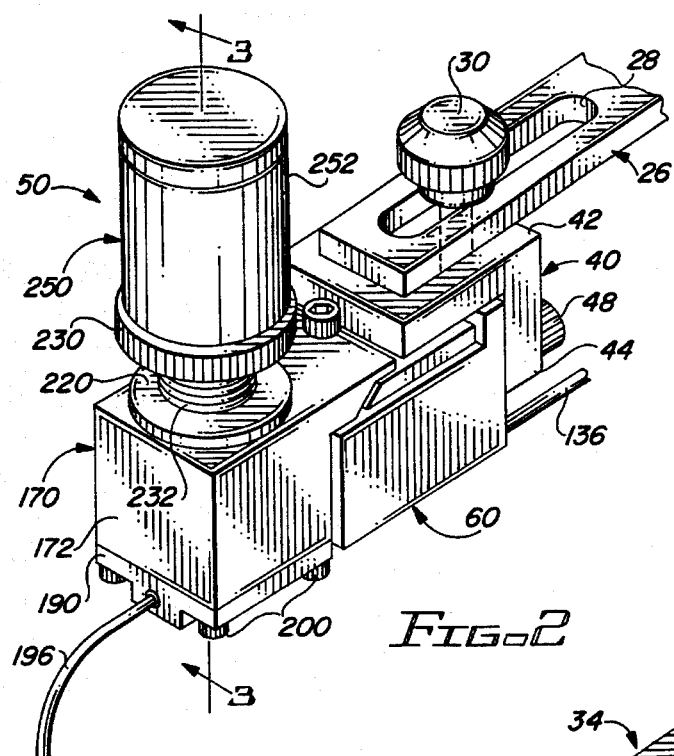
FIG. 2 is a perspective view of the apparatus of the present invention.

FIG. 2 is a perspective view of the inker apparatus 50 secured to the support arm 26. FIG. 2 is taken generally from circle 2 of FIG. 1. FIG. 3 is a side view in partial section through the inker apparatus 50 and the support arm 26 taken generally along line 3—3 of FIG. 2. FIG. 4 is an exploded perspective view of the inker apparatus 50 and its associated elements. For the following discussion, references will primarily be made to FIGS. 2, 3, and 4.

The inker apparatus 50 includes two primary assemblies, a solenoid assembly 60 and a pump assembly 170. The two assemblies are fastened together and are secured to a support frame 40 which is in turn secured to the support arm 26. The support frame 40 is a generally "L" shaped bracket having a horizontally extending arm 42 and a vertically extending arm 44. The horizontal arm 42 is a top arm, and the vertical arm 44 is a rear arm. The vertical or rear arm 44 includes a pair of apertures 46, and a pair of screws 48 extend through the apertures 46 to secure the solenoid assembly 60 to the support frame 40. A tapped aperture 43 extends downwardly through the top horizontal arm 42 and receives the threaded shank of the lock screw and knob 30 to secure the support frame or bracket 40 to the support arm 26.

The support frame 40, and the inker apparatus 50 secured thereto, is movable longitudinally relative to the support arm 26 by merely loosening the lock screw and knob 30 and moving the support frame or bracket 40 relative to the arm 26. When the appropriate or desired location of the inker apparatus 50 is reached, or when the inker apparatus 50 is appropriately positioned, the lock screw and knob 30 is simply tightened down by rotating the knob to firmly secure the support frame or bracket 40 to the arm 26.

The longitudinal movement of the screw and knob 30 in the slot 28 allows for a relatively wide range of locations at which the inker apparatus 50 may be disposed. Moreover, the support frame or bracket 40 may be moved or pivoted vertically relative to the ring 22 and the plate 20 by adjusting the knob and lock screw 38 to pivot the arm 26 upwardly or downwardly relative to the ring 22 and the plate 20 as discussed above.

The solenoid assembly 60 includes a housing 62 which is preferably made of aluminum. The housing 62 includes a rear wall 64 through which extends a pair of apertures 66 and 68. The housing 62 also includes a side wall 70 and a side wall 74. The side walls 70 and 74 include notched top portions 72 and 76, respectively. The housing 62 also includes an end wall 78 and a bottom wall 80.

The housing 62 essentially comprises an aluminum, generally rectangularly configured, box. A pair of solenoid coil support plates 90 and 110 are disposed in the housing 62 adjacent to the rear wall 64 and the front end wall 78, respectively. The coil support plates 90 and 110 preferably are made of steel.

The support plate 90 includes a generally centrally located aperture 92 extending through the plate. Three pivot ears extend upwardly from the plate. The pivot ears include a pivot ear 94, a pivot ear 96, and a pivot ear 98. See FIG. 4.

The coil support plate 110 includes a generally centrally located aperture 112 which is appropriately aligned with the aperture 92 and the plate 90. The plate 110 also includes two bores 114 and 120 which extend down into the plate from the top of the plate. The bore 114 receives a compression spring 116 and damper 118. The bore 120 receives a compression spring 122 and a damper 124. The purpose of the dampers 118 and 124 will be discussed in detail, below.

A solenoid coil 130 includes a cylinder or cylindrical form 132, and a coil comprising a plurality of wire wraps 134 disposed about the cylinder 132. As best shown in FIG. 3, and as may be understood from FIG. 4, the ends of the cylinder 132 extend into the bores 92 and 112 of the plates 90 and 110, respectively. The plates 90 and 110, with the coil 130 disposed therebetween, are then placed in the housing 62.

As may be understood from FIG. 3, the solenoid coil 130, together with the plates 90 and 110, are preferably potted to or within the housing 62 in a well known manner. Appropriately shielded or insulated ends 136 of the wire wraps or coil 134 extend outwardly from the housing 60, as is well known and understood, for appropriate electrical connection to energize the coil in a well known and understood manner. The electrical connections 136 are illustratively shown in FIG. 2.

A plate 150 is pivotly secured to the housing 60 through the end plate 90. The plate 150 includes a pair of outwardly extending ears 152 and 154 which are disposed between the ears 94, 96 and 96, 98, respectively. All five of the ears 94, 96, 98 and 152,154 include apertures extending through them. The apertures are appropriately aligned, and the two elements, the plates 90 and 150, are then appropriately secured together for pivotal movement of the plate 150 by a pin 156.

The plate 150 includes a sloping surface 158 remote from the ears 152 and 154. Adjacent to the sloping surface 158, and transversely centered with respect to the plate 150, is a tapped aperture 160. The purpose of the tapped aperture 160 is for securing the pump assembly 170 to the plate 150. This will be discussed in detail below.

The pump assembly 170 includes a housing block 172, which is preferably made out of aluminum. The housing block 172 includes a generally flat or planar top surface 174 and a similarly flat or planar bottom surface 175. The surfaces 174 and 175 are generally parallel to each other.

Extending through the block 172 between the top and bottom surfaces 174,175 is a bore 176. Spaced apart slightly from the bore 176, and extending downwardly into the block 172, is a tapped aperture 178. The aperture 178 extends through an outwardly extending flange portion of the block 172.

Beneath the outwardly extending flange portion of the block 172 is generally flat, horizontal wall 180 and a sloping wall 182. The top surface of the plate 150 and the sloping surface 158 of the plate 150 are disposed respectively against the bottom horizontal wall 180 and the sloping wall 182 to secure the pump assembly 170 to the plate 150, and accordingly to secure the pump assembly 170 to the solenoid assembly 60. A screw 184 extends through the aperture 178 and into the tapped aperture 160 to secure the housing block 172 to the plate 150.

A bottom plate 190, which may be made of plastic or of metal, as desired or as convenient, is appropriately secured to the bottom surface 175 of the block 172. The bottom plate 190 includes a bore 192 which extends downwardly from the top surface of the plate 190 and then generally horizontally through the plate 190 to allow ink to flow from the pump assembly 170 outwardly. There is a barrel fitting 194, which is preferably brass, disposed in the bore 192 for receiving a barrel 196. Ink flows from the bore 176 of the housing 172 and into the bore 192, through the barrel fitting 194, and outwardly through the barrel 196. The barrel 196 terminates in a tip 198.

As best shown in FIGS. 2 and 4, a plurality of screws 200 is used to secure the plate 190 to the bottom 175 of the pump housing block 172.

Within the bore 176 of the housing block 172 is a piston 210. The piston 210 is preferably made of steel. The piston 210 is biased upwardly in the bore 176 by a compression spring 212. The compression spring 212 extends between the bottom of the piston 210 and the top of the plate 190 about the bore 192.

The piston 210 is relatively loosely fitted in the bore 176 so that it does not prevent ink from flowing relatively freely in the bore 176 around the piston.

The bore 176, and the housing block 172, is closed by a cap insert or plug element 220. The cap insert or plug 220 is preferably made of aluminum or brass and is preferably press fitted into the bore 176. The insert or plug element 220 includes a tapped bore 222 extending through the element.

An ink cartridge or ink vial holder 230 is disposed in the insert or plug 220. The ink cartridge holder 230 includes an upper knob portion 232 from which extends a lower threaded cylindrical portion 234. The threaded cylindrical portion 234 threadedly engages the internally threaded or tapped bore 222 of the insert or plug 220.

The lower threaded cylindrical portion 234 of the ink cartridge holder 230 terminates in a generally flat bottom surface 236. Extending downwardly through the cartridge holder 232 are two bores, an upper threaded bore portion 238 and a lower bore portion 240. The bores 238 and 240 are coaxially aligned with each other, with the upper threaded bore 238 being substantially larger in diameter than the lower bore 240.

An ink cartridge or vial 250 is secured to the cartridge holder 230. The ink cartridge 250 includes a cylindrical ink housing portion 252 which is closed by a bottom wall 254. Extending downwardly from the bottom wall 254 is an externally threaded cylindrical extension 256. The threaded cylindrical extension 256 extends into the bore 238 of the cartridge or vial holder 230.

A bore 258 extends through the bottom wall 254 and through the cylindrical extension 256 to allow ink to flow from the cartridge 250 into the holder 230. The upper portion of the bore 258 comprises a generally conical valve seat portion 260. The bore 258 and its conical upper portion 260 will be discussed in detail below.

The ink cartridge or vial 250 is closed by a cap 270. The cap 270 includes a top portion 272, and a cylindrical extension 274 extends downwardly from the center of the top 272. Within the cylindrical extension 274 is a bore 276. An aperture 278 extends through the cap 270 to provide atmospheric pressure within the bore 276.

Figure 5:
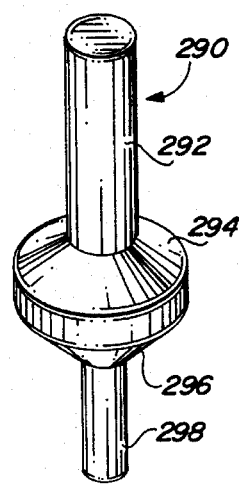
FIG. 5 is a perspective view of a portion of the apparatus of the present invention.
Figure 6:
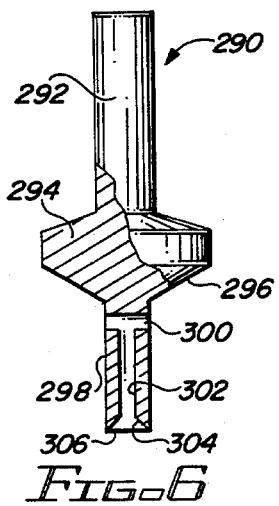
FIG. 6 is a side view in partial section of the apparatus of FIG. 5.

A plunger 290 is disposed in the ink cartridge 250. The plunger 290 is shown in perspective in FIG. 5, in addition to its showing in FIGS. 3 and 4. FIG. 5 is a perspective view of the plunger 290, and FIG. 6 is a side view in partial section of the plunger 290. For the following discussion of the plunger 290, reference will be made to FIGS. 5 and 6 in addition to FIGS. 3 and 4.

The plunger 290 comprises essentially a valve that prevents ink from flowing from the cartridge or vial 250 except when the cartridge is connected to the inker apparatus 50. The plunger 290 includes an upper cylindrical portion 292 which extends into the bore 276 of the cylindrical extension 274 of the cap 270 for aligning the plunger 290 with the seat 260. The plunger 290 also includes a central portion 294 and a lower cylindrical portion 298. The lower cylindrical portion 298 extends downwardly from the central portion 294 and is disposed in the bore 258 of the cylindrical portion 256 of the cartridge 250.

The central portion 294 of the plunger 290 includes a bottom conical surface 296 which is disposed in or on the conical valve seat portion 260 at the upper portion of the bore 258.

There is a transversely extending bore 300 which extends through the upper portion of the lower cylindrical portion 298, adjacent to the central portion 294. A longitudinally or axially extending bore 302 extends through the lower cylindrical portion 298 between the transverse bore 300 and a conical exit bore portion 304. The bore 304 terminates in a bottom 306. Ink flows through the transverse bore 300 and into the bores 302 and 304 when the plunger "valve" is open, or when the conical surface 296 is off the conical valve seat 260. The flow of ink is then through the bore 240 of the ink cartridge holder 230 and into the bore 176 of the pump 170.

The conical configuration of the exit bore 304 helps to insure that the flow of the ink from the bore 302 into the bore 240 is relatively smooth and generally unimpeded.

A compression spring 310 is disposed about the cylindrical extension 274 of the cap 270 between the top 272 of the cap 270 and the upper surface of the central portion 294 of the plunger 290. The spring 310 is a compression spring which urges the plunger 290 downwardly so that the lower conical surface 296 seats against the mating conical surface 260 of the bottom wall 254 of the cartridge 250 during transit and until the cartridge 250 is connected to the cartridge holder 230.

When the cartridge or vial 250 is threadedly inserted into the cartridge holder 230, by the engagement of the extension 256 into the bore 238, the bottom 306 of the lower or bottom cylindrical portion 298 of the plunger 290 contacts the bottom of the bore 238 about the bore 240. As the threaded engagement continues, the plunger 290 is moved against the bias of the spring 310 to unseat the valve portion or conical surface 296 from the conical valve seat 260.

With the conical valve portion 296 moved off its seat 260, ink then flows from the cartridge 250 through the bore 300 and the bore 302 and out of the flaring exit bore 304 and into the bore 240. From the bore 240 the ink flows into the bore 176 of the pump housing block 172.

From the bore 176, ink flows into the bore 192 of the bottom plate 190. The ink then flows through the barrel 196 to the tip 198. The flow of the ink outwardly from the tip 198 is in response to a pumping action of the piston 210. This will be discussed below.

Figure 7:
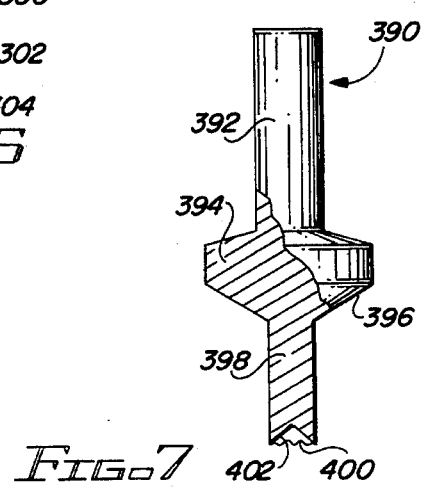
FIG. 7 is a side view in partial section of an alternate embodiment of the apparatus of FIGS. 5 and 6.

FIG. 7 is a side view in partial section of an alternate embodiment of the plunger or valve 290, comprising a plunger or valve 390. The plunger or valve 390 is substantially identical to the element 290 in overall configuration, but the element 390 does not include a transverse bore or a vertical bore comparable to the bores 300 and 302. Accordingly, ink does not flow through the element 390, but rather downwardly and around it.

The plunger or valve 390 includes an upper cylindrical portion 392, a central portion 394, and a lower cylindrical portion 398. The central portion 394 includes a bottom conical surface 396 which comprises a valve and which seats against the conical portion 260 of the cartridge holder 230. Again, the conical portion 260 comprises a valve seat against which the conical valve portion or surface 396 is disposed to prevent ink from flowing from the vial 250 during transport.

As with the corresponding portion of the plunger element 290, the upper cylindrical portion 392 of the plunger 390 extends into the bore 276 into the cap 270, and the central portion 394 is biased against the bottom wall 254 of the vial 250. Thus, the plunger or valve 390, with the sealing engagement between its bottom conical surface 396 and the conical valve seat 260, prevents the flow of ink out of the vial or cartridge 250 until the vial 250 has been inserted into the cartridge or vial holder 230. When the cartridge or vial 250, with the plunger or valve 390 in place, is inserted into the holder 230, and appropriately screwed downwardly, the plunger or valve 390 is unseated by contact between the bottom of the bore 238 and a scalloped bottom 400 of the plunger 390.

The bottom 400 is scalloped, rather than flat or planar, to allow the ink to flow into the bore 240. There is a generally conical recess 402 which extends upwardly into the cylindrical portion 398 from the bottom 400. The conical recess or bore 402 extends upwardly into the cylindrical portion 398 from the scalloped bottom 400. The purpose of the conical recess or bore 402 is simply to insure that the flow of ink from the bore 258 and through the scalloped end 400 and into the bores 238 and 240 is not impeded. Thus, the flow of ink is about the element 398 in the bore 258 and through the scalloped bottom 400 into the bottom or lower portion of the bore 238, and thence through the bore 240. In other respects, the operation of the plunger or the valve element 390 is substantially the same as that of the plunger or valve 290.

It will be noted that the plunger elements are effective as valves to prevent the flow of ink any time a vial or cartridge is removed from a holder. Thus, an ink vial 256 may be removed from the holder 230 at any time or for any reason without ink leaking from the vial. The spring 310 insures an appropriate seal by seating the plunger on the valve seat of the vial or cartridge.

The pumping action of the piston 210 is accomplished by the actuation of the solenoid coil 130.

Actuation of the solenoid coil 130 results in the magnetic attraction of the plate 150 downwardly toward the steel support plate 110. The plate 150 pivots on the pin 156, as discussed above. Since the pump assembly 170 is secured to the plate 150, the pump assembly 170 moves downwardly with the plate 150. The movement of the plate 150 and of the pump assembly 170 is relatively short, or comprises a relatively short predetermined distance, which distance is sufficient to impart movement to the piston 210 against the bias of the spring 212.

The downward movement of the plate 150 is dampened by the dampers 118 and 124 disposed in the bores 114 and 120, respectively, in the plate 110. The dampers 118 and 124 are biased by the springs 116 and 122, respectively, as discussed above. Thus there is a smooth starting and stopping of the plate 150 and the pump assembly 170 as the solenoid coil 134 is actuated.

When the pump assembly 170 and the holder 230 and vial 250 come to a stop when the plate 150 contacts the top or upper portion of the solenoid housing 62, the piston 210 continues to move by virtue of its kinetic energy or its inertia. The continued movement of the piston 210 is sufficient to impart a pumping action on the ink in the bore 176 of the housing block 172, and accordingly a spot of ink extends from the tip of the barrel 196 and is deposited on a defective die.

The piston 210 is biased upwardly by the compression spring 212 against the bottom 236 of the cartridge holder 230 when the inker apparatus 50, and accordingly when the pump assembly 170, is in idle time, or during idle time. The piston 210 accordingly closes the bore 240 to prevent ink from dripping or running from the barrel 196 except when the inker apparatus is actuated to dot a defective die. The piston 210 thus performs two functions, sealing the cartridge holder 230 to prevent ink drips during idle time, and pumping the ink when the solenoid assembly 60 is actuated.

The amount or quantity of ink that is deposited may be adjusted by rotating the knob portion 232 of the cartridge holder 230. Adjustment of the knob 232 moves the holder 230, and particularly the lower cylindrical portion 234, relative to the piston 210. That is, the threaded engagement between the cylindrical portion 234 and the cap or plug 220 allows the holder 230 to move upwardly or downwardly in the bore 176 to provide the desired distance that the piston 210 may move in the bore 176 against the bias of the spring 212. This distance accordingly will result in a greater or lesser movement of the piston 210, and the movement of the piston 210 in turn results in some quantity of ink flowing. The amount or quantity of ink that flows varies according to the distance the piston 210 moves.

The pump assembly 60 provides consistent dot sizes regardless of the time interval between actuation. The dot size may be varied or controlled by adjustments of the piston travel in response to the positioning of the cartridge holder 230 relative to the piston 210. Or, as clearly explained above, the dot size is varied by controlling the piston travel by moving the cartridge holder 230 and the ink vial 250 relative to the pump housing 170 and to the piston 210 therein.

It will be noted that when the solenoid assembly 60 is actuated, there is movement of the entire pump assembly 170, including the ink vial 250. The periodic movement of the ink vial 250 provides sufficient movement of the ink therein to prevent the separation of the ink components, and the ink accordingly maintains its integrity.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What is claimed is:

1. Inker apparatus for marking a defective die after the defective die has been detected comprising, in combination:

ink vial means for holding a quantity of ink having ink components therein for marking the defective die;

solenoid means actuable in response to the detection of a defective die for moving the ink vial means; and pump means connected to the ink vial means and movable with the ink vial means in response to activation of the solenoid means for pumping a quantity of ink to mark the defective die, including
   a bore for receiving ink from the ink vial means,
   a piston movable in the bore in response to movement of the ink vial means for pumping ink, and
   holder means for receiving the ink vial means and through which the ink flows to the bore.

2. The apparatus of claim 1 in which the ink vial means is connected to the pump means and to the solenoid means such that actuation of the solenoid means causes movement of the vial means and of the ink therein to prevent separation of ink components.

3. The apparatus of claim 1 in which movement of the pump means in response to actuation of the solenoid means causes movement of the piston for pumping the ink.

4. The apparatus of claim 1 in which the ink vial means includes plunger means for preventing ink from flowing from the ink vial means, and having a valve portion and a valve seat for receiving the valve portion during transit of the ink vial means and when the ink vial means is removed from the holder means for preventing ink from flowing through the valve seat.

5. The apparatus of claim 4 in which the holder means includes means for moving the plunger means to move the valve portion from the valve seat to allow ink to flow from the ink vial means to the bore of the pump means.

6. The apparatus of claim 4 in which the plunger means includes an upper cylindrical portion, a central portion which includes the valve portion, and a lower cylindrical portion, and the holder means includes a first bore for receiving the lower cylindrical portion of the plunger means and a second bore communicating with the first bore and with the bore of the pump means and through which ink flows from the ink vial means to the bore of the pump means.

7. The apparatus of claim 6 in which the pump means further includes means for biasing the piston against the second bore of the holder means for preventing ink from flowing from the second bore into the bore of the pump means until the solenoid means is actuated to mark a defective die.

8. The apparatus of claim 6 in which the ink vial means includes a cylindrical portion for receiving the upper cylindrical portion of the plunger means for aligning the plunger means with respect to the valve seat.

9. The apparatus of claim 1 in which the pump means further includes a plate pivotally secured to the solenoid means, and the pump means is secured to the plate, and actuation of the solenoid means causes movement of the plate and of the pump means and the ink vial means connected to the pump means.

10. The apparatus of claim 1 in which the holder means is adjustable relative to the piston for controlling the quantity of ink pumped by the piston.

11. The apparatus of claim 1 in which the pump means further includes a housing block, and the bore extends through the housing block.

12. The apparatus of claim 11 in which the housing block of the pump means moves a predetermined distance in response to the activation of the solenoid means, and the piston continues to move in the bore to pump the ink after the housing block has moved the predetermined distance.

13. The apparatus of claim 1 in which the piston is movable in the bore in response to movement of the pump means, and movement of the pump means is responsive to the actuation of the solenoid means.

14. The apparatus of claim 13 in which the movement of the piston to pump ink is greater than the movement of the pump means.

15. Inker apparatus for marking a detected defective die comprising, in combination:

ink cartridge means containing a quantity of ink containing ink components therein for marking the defective die;

solenoid means for moving the ink cartridge means and actuable in response to the detection of a defective die;

pump means secured to the ink cartridge means and movable therewith in response to the actuation of the solenoid means for pumping a quantity of ink to mark the defective die, including
   a block,
   a bore in the block, and
   means for delivering ink from the bore to the defective die; and a piston movable in the bore in response to movement of the pump means for pumping ink to the means for delivering ink.

16. The apparatus of claim 15 in which the means for delivering ink comprises a barrel connected to the bore for receiving ink pumped by the piston and through which the pumped ink flows to mark the defective die.

17. The apparatus of claim 15 in which the block moves in response to the actuation of the solenoid means, and the piston moves independently of the block to pump the ink.

18. The apparatus of claim 17 in which the block stops moving after the solenoid is actuated and the piston continues to move to pump the ink after the block has stopped moving.

19. The apparatus of claim 15 in which the ink cartridge means is secured to the pump means and moves with the pump means in response to actuation of the solenoid means, and movement of the ink cartridge means prevents separation of ink components.

20. The apparatus of claim 15 in which the pump means includes ink holder means for receiving and holding the ink cartridge means, and the ink holder means is adjustable relative to the block and to the piston for varying the amount of ink pumped by the piston.

* * * * *